United States Patent [19]

Freedman et al.

[11] 3,787,958

[45] Jan. 29, 1974

[54] THERMO-ELECTRIC MODULAR STRUCTURE AND METHOD OF MAKING SAME

[75] Inventors: Norman S. Freedman, Berkeley Heights; Carel W. Horsting, Caldwell; Walter F. Lawrence, Verona; John J. Carrona, Scotch Plains, all of N.J.

[73] Assignee: Granted to the United States Atomic Energy Commission under the Provisions of 42 U.S.C. 2182, Washington, D.C.

[22] Filed: Aug. 18, 1965

[21] Appl. No.: 505,079

Related U.S. Application Data

[62] Division of Ser. No. 162,281, Dec. 26, 1961.

[52] U.S. Cl. .................. 29/472.3, 29/473.1, 29/501, 29/573

[51] Int. Cl. .................. B23k 31/02

[58] Field of Search .... 29/155.5, 472.3, 473.1, 501, 29/573

[56] References Cited

UNITED STATES PATENTS

| | | | |
|---|---|---|---|
| 3,000,092 | 9/1961 | Scuro | 29/573 |
| 3,470,608 | 10/1969 | Maaz | 29/573 X |

*Primary Examiner*—Benjamin R. Padgett
*Assistant Examiner*—R. E. Schafer
*Attorney, Agent, or Firm*—John A. Horan
A. Anderson

EXEMPLARY CLAIM

1. A method of making a thermoelectric module with the aid of an insulating wafer having opposite metallized surfaces, a pair of similar equalizing sheets of metal, a hot-junction strap of metal, a thermoelectric element having hot- and cold-junction surfaces, and a radiator sheet of metal, said method comprising the steps of a. brazing said equalizer sheets to said opposite metallized surfaces, respectively, of said insulating wafer with pure copper in a non-oxidizing ambient, b. brazing one surface of said hot-junction strap to one of the surfaces of said equalizing sheet with a nickel-gold alloy in a non-oxidizing ambient, and c. diffusion bonding said hot-junction surface of said thermoelectric element to the other surface of said hot-junction strap and said radiator sheet to said cold-junction surface of said thermoelectric element, said diffusion bonding being carried out in a non-oxidizing ambient, under compressive loading, at a temperature of about 550°C., and for about one-half hour.

4 Claims, 4 Drawing Figures

PATENTED JAN 29 1974 3,787,958

Figure 3:
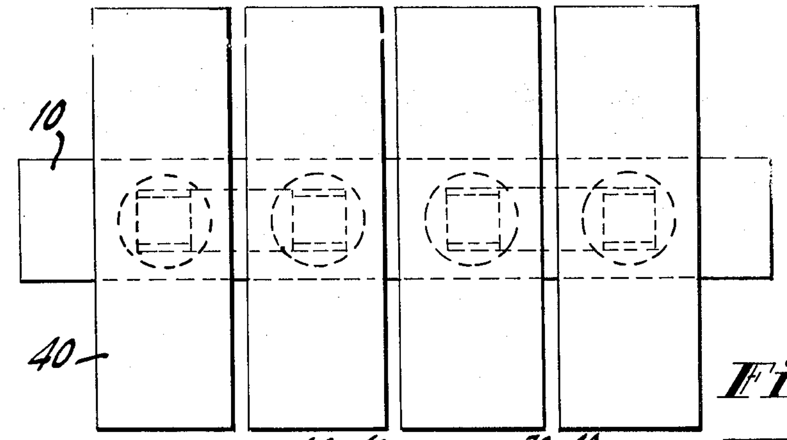

INVENTORS
NORMAN S. FREEDMAN
CAREL W. HORSTING
WALTER F. LAWRENCE &
JOHN J. CORRONA

BY J. R. Webb
AGENT

THERMO-ELECTRIC MODULAR STRUCTURE AND METHOD OF MAKING SAME

This application is a division of application Ser. No. 162,281, filed Dec. 26, 1961.

The invention described herein was made in the course of, or under, a contract with the U.S. Atomic Energy Commission This invention relates generally to thermoelectric energy converters, and more particularly to an improved method of making a thermoelectric modular structure. The improved thermoelectric modular structure is particularly useful for attachment to a heated surface to convert thermal energy into electrical energy.

It has been proposed to utilize the thermal energy in a metal body to heat the thermoelectric elements of a thermocouple to generate electricity. In order to obtain a maximum transfer of heat between the metal body and the thermoelectric elements, however, it is necessary, in most cases, to place the thermoelectric elements as close to the metal body as possible without actually making electrical contact with it. Where the metal body is a part of a moving vehicle, the thermoelectric elements should be bonded or rigidly fixed to the metal body to withstand vibrations, sudden shocks, and relatively large expansions and contractions of the metal body without breaking off.

Attempts to insulate electrically, but not thermally, the thermoelectric elements of a thermocouple from a metal body have presented difficult problems of construction in the prior art. This is especially true where the bond between the thermoelectric element and the metal body must go through many thermal cycles over a wide range of temperatures, and where the metal body and the insulating material have different coefficients of expansion.

It is an object of the present invention to provide an improved method of making thermoelectric modules suitable for attachment directly to a heated metal body to convert the thermal energy of the body into electricity.

Another object of the present invention is to provide an improved method of attaching a thermoelectric module to a metal body so as to maintain the module in good heat exchange relationship with the metal body and yet insulate it electrically from the body.

The improved thermoelectric module comprises a bonded stack of substantially flat components, adjacent ones of which are brazed or diffusion bonded to each other. The stack of components comprises a first equalizer sheet of metal, a wafer of insulating material having metallized surfaces, a second equalizer sheet, preferably of the same metal as the first equalizer sheet, a hot-junction connecting strap of metal. a semiconductor thermoelectric element, and a radiator sheet, in the order named. In the first step of the method of making the module, the first and second equalizer sheets are brazed to opposite large surfaces of the metallized insulating wafer with a high melting point, ductile metal, such as pure copper, at an elevated temperature in vacuo or in a dry, nonoxidizing atmosphere. This construction equalizes strains on both sides of the insulating wafer and prevents it from breaking as a result of repeated expansions and contractions. In the second step of the method, a connecting strap is brazed to the second equalizer sheet with a ductile metal of a lower melting point than that of the connecting strap. In the third step of the method, the connecting strap, the semiconductor thermoelectric element, and the radiator sheet are diffusion bonded together by compressing these parts in a vacuo or in a heated non-oxidizing ambient for a period of time. In the last-mentioned step, the thermoelectric element may have upper and lower shoes, each comprising a gold plated metal, to aid in the diffusion bonding.

Figures 1, 4:
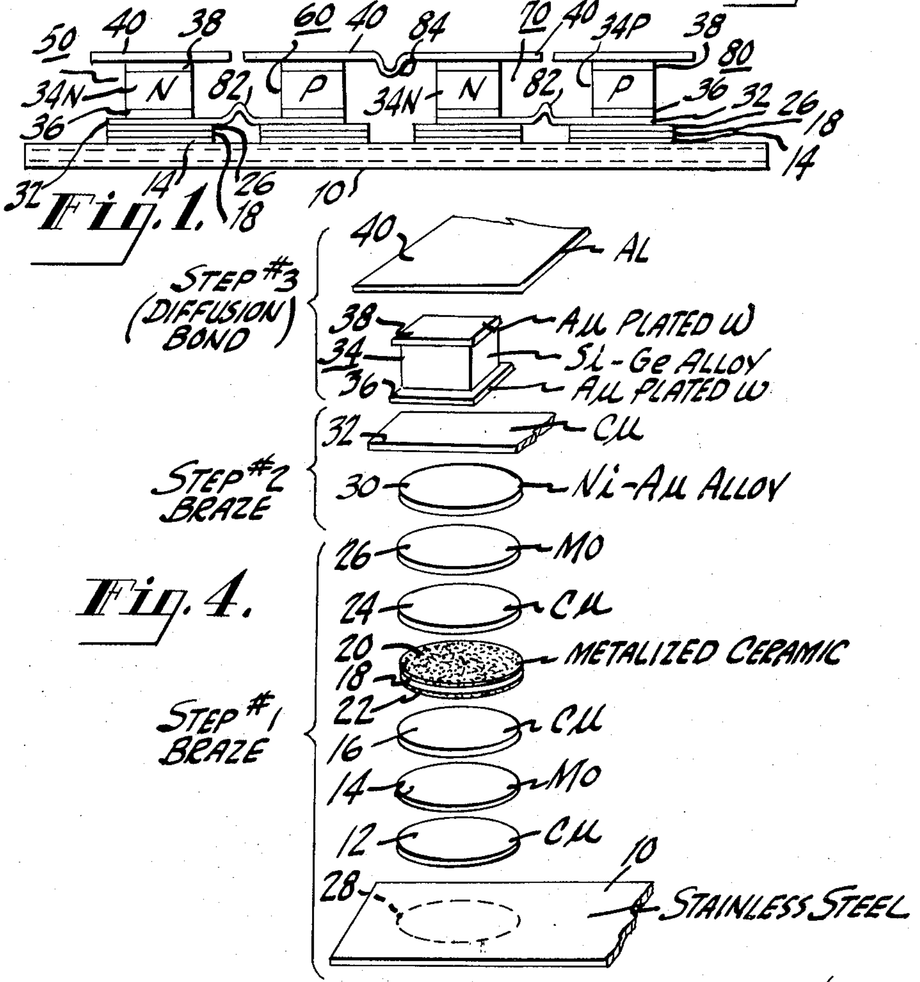
Figure 2:
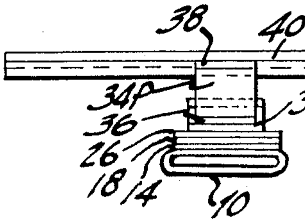

The novel features of the present invention, as well as additional objects and advantages thereof, will be more readily understood from the following description, when read in connection with the accompanying drawing, in which the same reference characters designate similar parts throughout, and in which:

FIGS. 1, 2 and 3 are side elevational, and elevational, and top plan views, respectively, of a thermoelectric energy converter employing improved thermoelectric modular structures; and FIG. 4 is an exploded view of an improved thermoelectric modular structure, with parts broken away, showing the components of the modular structure that are involved in the steps of an improved method of making them in accordance with the present invention.

The construction of the improved thermoelectric modular structure, that is module, can be understood best from a description of the novel method of making it. Referring, first, to FIG. 4, there are shown components of the improved thermoelectric modular structure and a metal body 10 to which the improved thermoelectric modular structure is to be affixed in a heat exchange relationship therewith. The body 10 may be a duct, such as a stainless steel tube, for conducting a heated fluid. Where temperatures in the order of 550°C. are to be used, for example, the body 10 may conduct the flow of molten sodium and potassium. The stainless steel body 10 may be plated with cobalt or nickel to prevent the intergranular penetration of the metals that are brazed or bonded to it.

To affix the improved thermoelectric modular structure to a surface of the body 10, a plurality of components, in the form of sheets or wafers, are placed in a stack and brazed or diffusion bonded to each other. Thus, for example, as a first step in the method of construction, a first braze sheet 12 of a braze material, such as pure copper, a first equalizer sheet 14 of a metal, such as molybdenum, a second braze sheet 16 of the same metal as the first braze sheet 12, a wafer 18 of insulating material, such as a ceramic material (for example, aluminum oxide or beryllium oxide), having upper and lower metallized surfaces 20 and 22, respectively, a third braze sheet 24 of the same metal as that of the first braze sheet 12, and a second equalizer sheet 26, preferably of the same metal as the first equalizer sheet 14, are stacked in a column, in the order named, and over the surface area 28 of the body 10, within the illustrated dashed circle shown in FIG. 4. The stacked sheets 12, 14, 16, the wafer 18, the sheets 24, 26, and the body 10 are placed in a non-oxidizing atmosphere, preferably in a dry hydrogen atmosphere or in vacuo, and heated to a temperature of about 1,100°C. The pure copper sheets 12, 16, and 24 melt and braze adjoining metal surfaces to each other. The sheets of the stack may be shaped in the form of discs.

Pure copper is used for the brazing sheets 12, 16, and 24 to withstand relatively large differential stresses resulting from the differences in the thermal expansions between different metals. The equalizer sheets 14 and 26 of molybdenum, as well as the metallized insulating wafer 18, may be plated with iron to improve their braze wettability. The insulating wafer 18 functions as a good electrical insulator, and yet it is a good thermal conductor. It is noted that the edges of the wafer 18 are not metallized so that the wafer can function as an insulator. Thus, the thermoelectric element, to be described hereinafter, can be insulated from the body 10 and still be bonded thereto in a heat transfer relationship.

By brazing similar metals, such as the equalizer sheets 14 and 26 of molybdenum, to both sides of the insulating wafer 18, respectively, upper and lower stresses on the insulating wafer 18 are equalised, and any tendency for the wafer 18 to crack or break under relatively large expansions and contractions is virtually eliminated by this construction. It is also within the contemplation of this invention to use different metals for the equalizer sheets 14 and 26, depending upon the metal to which each equalizer sheet is bonded.

In a second step, a braze sheet 30 having a melting point lower than that of copper, such as a nickel-gold alloy, and a hot-junction connecting strap 32 of copper are placed on the equalizer sheet 26, in the order named. The braze sheet 30 and the connecting strap 32 are heated in vacuo or in a non-oxidizing atmosphere at a temperature below the melting point of copper, but to the temperature necessary to cause the braze sheet 30 to melt. In this step, the connecting strap 32 is brazed to the equalizer sheet 26.

A thermoelectric element 34, such as a semiconductor material of silicon-germanium alloy of either the P-type or the N-type, depending upon its doping, may have bonded on fixed to its lower and upper surfaces, respectively, gold-plated or shoes 36 and 38 of tungsten. The shoes 36 and 38 may be in the form of square sheets and comprise the hot and cold junction shoes, respectively, of the thermoelectric element 34. The shoes 36 and 38 may be diffusion bonded to the thermoelectric element 34 by the application of pressure and heat in vacuo for a period of time until a strong diffusion bond is formed.

In a third step, the thermoelectric element 34, with its lower and upper gold-plated shoes 36 and 38 attached, is stacked on the connecting strap 32. A radiator sheet 40 of aluminum, that functions as a cold-junction connecting strap, is placed on the upper, gold-plated tungsten shoe 38. The entire assembly is now placed under compression by any suitable compressive loading means and heated in a non-oxidizing atmosphere or in vacuo at about 550°C. for about one-half hour. In this step, the lower shoe 36 is diffusion bonded to the hot-junction connecting strap 32, and the upper shoe 38 is diffusion bonded to the cold-junction strap 40.

In the third step, the outer surfaces of the tungsten shoes 36 and 38 should preferably be nickel plated before they are gold plated to provide good diffusion bonds. Alternatively, instead of gold plating the tungsten shoes 36 and 38, gold foil may be placed between the lower shoe 36 and the connecting strap 32 and between the upper shoe 38 and the radiator sheet 40 to effect good diffusion bonding.

Steps one and two of the aforementioned method of making the thermoelectric modular structure may be combined into a single step if a brazing material is used that has a lower melting point than that of the connecting strap 32. If, for example, nickel-gold alloy sheets are substituted for the copper braze sheets 12, 16, and 24, steps one and two could be combined into a single step.

Referring, now, to FIGS. 1, 2, and 3, there is shown a thermoelectric energy converter, comprising thermoelectric modular structures 50, 60, 70, and 80, for converting heat energy from the surface of the body 10 into electrical energy. The thermoelectric modular structures 50, 60, 70, and 80 are substantially similar to each other, except for the thermoelectric elements 34N of N-type material in the structures 50 and 70 and the thermoelectric elements 34P of P-type material in the modular structures 60 and 80. Adjacent modular structures, having thermoelectric elements of opposite conductivity types, comprise a thermocouple. Since the thermoelectric elements of adjacent modular structures may be arranged in parallel alignment, as shown in FIG. 1, their hot and cold junctions may be adjacent to each other, respectively. Thus, the hot-junction connecting strap 32 of the modular structure 50 is also used as the hot-junction connecting strap for the modular structure 60. The connecting strap 32 may be kinked, as at 82, between adjacent modular structures in each thermocouple to provide for expansion and contraction of the body 10 at different temperatures. The cold-junction straps, that is, the radiator sheets 40, of adjacent thermocouples are connected to each other to connect the thermocouples electrically in series. Thus, for example, the aluminum radiator sheet 40 of the modular structure 60 is connected to the aluminum radiator sheet 40 of the modular structure 70. The radiator sheet 40 connecting adjacent thermocouples may be kinked, as at 84, to provide for expansions and contractions caused by differences in temperature.

An electrical output of the thermoelectric heat energy converter shown in FIGS. 1, 2, and 3 can be derived between the radiator sheet 40 of the modular structure 50 and the radiator sheet 40 of the modular structure 80. It is noted that a thermoelectric energy converter module comprising a plurality of thermoelectric modular structures, as shown in FIG. 1, for example, may be constructed as a unit by constructing each of the separate thermoelectric modules simultaneously on the metal body 10.

From the foregoing description, it will be apparent that there has been provided an improved thermoelectric modular structure and a novel method of making the same. While embodiments of the modular structure and its novel method of manufacture have been shown in diagrammatic form, variations in the modular structure and method of making it, all coming within the spirit of this invention, will, no doubt, readily suggest themselves to those skilled in the art. Hence, it is desired that the foregoing shall be considered merely as illustrative and not in a limiting sense.

What is claimed is:

1. A method of making a thermoelectric module with the aid of an insulating wafer having opposite metallized surfaces, a pair of similar equalizing sheets of metal, a hot-junction strap of metal, thermoelectric element having hot-and cold-junction surfaces, and a radiator sheet of metal, said method comprising the steps of a. brazing said equalizer sheets to said opposite metallized surfaces, respectively, of said insulating wafter with pure copper in a non-oxidizing ambient, b. brazing one surface of said hot-juntcion strap to one of the surfaces of said equalizing sheet with a nickel-gold alloy in a non-oxidizing ambient, and c. diffusion bonding said hot-junction surface of said thermoelectric element to the other surface of said hot-junction strap and said radiator sheet to said cold-junction surface of said thermoelectric element, said diffusion bonding being carried out in a non-oxidizing ambient, under compressive loading, at a temperature of about 550°C., and for about one-half hour.

2. A method of making a thermoelectric modular structure with the aid of an insulating wafer having metallized opposite surfaces, a pair of equalizing sheets of metal, a pair of braze sheets of a relatively high melting point metal, a braze sheet of a relatively lower melting point metal, a hot-junction connecting strap of metal, a thermoelectric element, and a cold-junction connecting strap of metal, said method comprising the steps of a. stacking into a stack, in the order named, one of said equalizer sheets, one of said pair of braze sheets, said wafer, the other of said pair of braze sheets, and the other of said equalizer sheets, b. heating said stack until said pair of braze sheets melt and braze said equalizer sheets to said metallized surfaces of said wafer, respectively, c. stacking said braze sheet of a relatively lower melting point metal on said other equalizer sheet, d. stacking said hot-junction connecting strap on said last-mentioned braze sheet, e. heating said stacked sheets and strap to melt only said braze sheet of said lower melting point metal, whereby to braze said hot-junction connecting strap to said other equalizing sheet, and f. diffusion bonding one surface of said thermoelectric element to said hot-junction connecting strap and another surface of said thermoelectric element to said cold-junction connecting strap.

3. A method of making a thermoelectric modular structure with the aid of an insulating wafer having metallized opposite surfaces, a pair of equalizing sheets of metal, a pair of braze sheets of pure copper, a braze sheet of a nickel-gold alloy, a hot-junction connecting strap of metal, a thermoelectric element having hot and cold junction shoes, and a cold-junction connecting strap of metal, said method comprising the steps of a. stacking into a stack, in the order named, one of said equalizer sheets, one of said pair of braze sheets, said wafer, the other of said pair of braze sheets, and the other of said equalizer sheets, b. heating said stack to about 1,100°C. to melt said copper braze sheets and to braze said equalizer sheets to said metallized surfaces of said wafer, respectively, c. stacking said braze sheet of nickel-gold alloy and said hot-junction connecting strap on said other equalizer sheet, in the order named, d. heating said stack to melt only said braze sheet of nickel-gold alloy, whereby to braze said hot-junction connecting strap to said other equalizer sheet, e. stacking said thermoelectric element with its hot junction shoe on said hot-junction connecting strap and its cold junction shoe on said cold-junction connecting strap, f. applying compressive pressure to said stack, and g. heating said pressurized stack in a non-oxidizing ambient at about 550°C. for about one-half hour.

4. A method of making a thermoelectric modular structure comprising a metal to be heated, an insulating wafer having metallized, opposite surfaces, a pair of equalizing sheets of metal, three braze sheets of a relatively high melting point metal, a braze sheet of a relatively lower melting point metal, a hot-junction connecting strap of metal, a thermoelectric element having hot- and cold-junction shoes, two sheets of gold foil, and a cold-junction connecting strap of metal, said method comprising the steps of a. stacking into a stack on said metal to be heated, in the order named: one of said three braze sheets, one of said equalizer sheets, a second of said three braze sheets, said wafer, a third of said three braze sheets, and the other of said equalizer sheets, b. heating said stack until said three braze sheets melt and braze said equalizer sheets to said metallized surfaces of said wafer, respectively, c. stacking as a continuation of said stack, said braze sheet of a relatively lower melting point metal on said other equalizer sheet, and said hot-junction connecting strap on said last-mentioned braze sheet, d. heating said stack to melt only said braze sheet of said lower melting point metal, whereby to braze said hot-junction connecting strap to said other equalizer sheet, e. stacking on said hot-junction connecting strap, as a further continuation of said stack, in the order named, one of said sheets of gold foil, said thermoelectric element with said hot-junction shoe in contact with said one sheet of gold foil, the other of said sheets of gold foil in contact with said cold-junction shoe, and said cold-junction connecting strap in contact with said other sheet of gold foil, and f. heating said stack at about 550°C. in a non-oxidizing ambient while under compressive loading for about one-half hour.

* * * * *